(12) United States Patent
Okamoto et al.

(10) Patent No.: US 12,218,259 B2
(45) Date of Patent: Feb. 4, 2025

(54) SOLAR CELL AND MANUFACTURING METHOD

(71) Applicant: KANEKA CORPORATION, Osaka (JP)

(72) Inventors: Shimpei Okamoto, Settsu (JP); Junichi Nakamura, Settsu (JP)

(73) Assignee: KANEKA CORPORATION, Osaka (JP)

( * ) Notice: Subject to any disclaimer, the term of this patent is extended or adjusted under 35 U.S.C. 154(b) by 22 days.

(21) Appl. No.: 18/163,134

(22) Filed: Feb. 1, 2023

(65) Prior Publication Data

US 2023/0178665 A1 Jun. 8, 2023

Related U.S. Application Data

(63) Continuation of application No. PCT/JP2021/028729, filed on Aug. 3, 2021.

(30) Foreign Application Priority Data

Aug. 6, 2020 (JP) ................. 2020-134104

(51) Int. Cl.
*H01L 31/0224* (2006.01)
*H01L 31/068* (2012.01)
*H01L 31/18* (2006.01)

(52) U.S. Cl.
CPC .... *H01L 31/022433* (2013.01); *H01L 31/068* (2013.01); *H01L 31/1804* (2013.01)

(58) Field of Classification Search
None
See application file for complete search history.

(56) References Cited

U.S. PATENT DOCUMENTS

2011/0277817 A1 11/2011 Ide et al.
2013/0244371 A1\* 9/2013 Sewell ................ H01L 31/0488
438/96

(Continued)

FOREIGN PATENT DOCUMENTS

EP          3 731 282 A1   10/2020
JP          2018-163988 A  10/2018

(Continued)

OTHER PUBLICATIONS

WO2021/032328A1 machine translation (Year: 2021).\*
International Search Report issued in PCT/JP2021/028729; mailed Sep. 7, 2021.

*Primary Examiner* — Ryan S Cannon
(74) *Attorney, Agent, or Firm* — Studebaker & Brackett PC

(57) ABSTRACT

A solar cell capable of preventing short-circuiting during signaling connection and a method for manufacturing the solar cell. A solar cell includes a semiconductor substrate, a first semiconductor layer having a conductivity type different from that of the semiconductor substrate. The first semiconductor layer includes a main functional portion which has a first base end portion on one side in a first direction of the semiconductor substrate over an entire length in a second direction and a plurality of first collecting portions extending from the first base end portion toward the other side in the first direction and on which a first electrode pattern is stacked, and an isolation portion which is formed linearly at an end portion on the other side in the first direction of the semiconductor substrate over an entire length in the second direction and on which the first electrode pattern is not stacked.

5 Claims, 3 Drawing Sheets

(56) References Cited

U.S. PATENT DOCUMENTS

| | | | |
|---|---|---|---|
| 2016/0093758 A1* | 3/2016 | Fujishima | H01L 31/18 |
| | | | 136/244 |
| 2018/0108796 A1 | 4/2018 | Heng et al. | |
| 2019/0189812 A1* | 6/2019 | Yoshikawa | H01L 31/022441 |
| 2019/0296171 A1 | 9/2019 | Chang et al. | |

FOREIGN PATENT DOCUMENTS

| | | | | |
|---|---|---|---|---|
| JP | 2018-186248 A | 11/2018 | | |
| JP | 2020-013868 A | 1/2020 | | |
| WO | WO-2009147890 A1 * | 12/2009 | ..... | H01L 31/022433 |
| WO | 2010/021204 A1 | 2/2010 | | |
| WO | 2019/146366 A1 | 8/2019 | | |
| WO | WO-2021032328 A1 * | 2/2021 | ..... | H01L 31/022441 |

\* cited by examiner

SOLAR CELL AND MANUFACTURING METHOD

CROSS-REFERENCE TO RELATED APPLICATIONS

This application claims benefit of priority to International Patent Application No. PCT/JP2021/028729, filed Aug. 3, 2021, and to Japanese Patent Application No. 2020-134104, filed Aug. 6, 2020, the entire contents of each are incorporated herein by reference.

BACKGROUND

Technical Field

The present disclosure relates to a solar cell and a method of manufacturing the same.

Background Art

A back contact solar cell is known. In the back contact type, a pair of semiconductor layers having different conductivity types are formed in a complementary region on the back surface side of a semiconductor substrate, and an electrode pattern is stacked on each of the semiconductor layers. In order to reduce the travel distance of carriers in the back contact solar cell, it is preferable that band-shaped semiconductor films having different polarity are alternately arranged in a plan view, and band-shaped semiconductor films having the same polarity are connected to each other. Considering that a module is formed by connecting a plurality of solar cells, it is assumed that each band-shaped semiconductor film is arranged so as to extend in the direction of connection of the solar cells, a base end portion connecting an end portion of a band-shaped semiconductor of one conductivity type is provided on one side in the direction of connection of the solar cells, and a base end portion connecting an end portion of a band-shaped semiconductor of the other conductivity type is provided on the other side in the direction of connection of the solar cells as described, for example, in Japanese Unexamined Patent Application, Publication No. 2018-163988. In other words, it is assumed that the pair of semiconductor layers is formed in a comb shape, and the pair of semiconductor layers are arranged so as to mesh with each other.

Japanese Unexamined Patent Application, Publication No. 2018-163988 discloses a manufacturing method of obtaining two solar cells by forming a pair of solar cell structures (semiconductor layers and electrodes) on a semiconductor wafer so that the connection portions of one of the semiconductor layers are adjacent to each other, and cutting the semiconductor wafer at the boundary of the cell structures. In Japanese Unexamined Patent Application, Publication No. 2018-163988, two solar cells are formed by cutting an octagonal semiconductor wafer having chamfered portions at four corners at the center, and as a result, each solar cell has an asymmetrical shape in which corner portions on the side where the base end portion of one semiconductor layer is formed are chamfered.

When a solar cell module is formed by using a plurality of solar cells, it is common to arrange a plurality of solar cell strings formed by arranging a plurality of solar cells in a line. In the solar cell module described in Japanese Unexamined Patent Application, Publication No. 2018-163988, since the shape of the solar cell is asymmetric, the orientation of the solar cell in the solar cell string can be easily confirmed. Since the orientation of the solar cell string is determined depending on the electrical connection, in the solar cell module of Japanese Unexamined Patent Application, Publication No. 2018-163988, the orientation of the solar cell is reversed for each row. If a plurality of solar cells are formed on a semiconductor wafer so as to be oriented in the same direction, a solar cell whose polarity of a semiconductor layer is inverted can be obtained, so that chamfered portions of the solar cell modules can be made uniform on the same side.

SUMMARY

In the Japanese Unexamined Patent Application, Publication No. 2018-163988, although a gap is formed between the solar cells, a so-called singling structure in which end portions of the solar cells are overlapped in a certain direction may be adopted as a configuration in which output per area of the module is improved. In this case, the electrode structure at the end of the front solar cell comes into contact with the semiconductor substrate (light receiving surface) of the back solar cell. When the polarity of the contact portion of the electrode structure of the front solar cell is equal to the polarity of the rear semiconductor substrate, the solar cell may be short-circuited. As described above, when a plurality of solar cells are formed on a semiconductor wafer so as to be oriented in the same direction, a minute semiconductor layer having unintended polarity may be formed at an end portion of the solar cell due to an error in a cutting position. For this reason, if a plurality of solar cells are formed on a semiconductor wafer in the same orientation, a short circuit may occur at the time of connection of a sensing ring. In view of such circumstances, the present disclosure provides a solar cell capable of preventing a short circuit at the time of a sensing ring connection, and a manufacturing method thereof.

A solar cell according to one embodiment of the present disclosure includes a semiconductor substrate having a first conductivity type, a first semiconductor layer formed on a back surface of the semiconductor substrate and having a conductivity type different from that of the semiconductor substrate, a second semiconductor layer formed on a back surface of the semiconductor substrate and having the same conductivity type as the semiconductor substrate, a first electrode pattern stacked on the first semiconductor layer, and a second electrode pattern stacked on the second semiconductor layer. The first semiconductor layer is a main functional portion having a first base end portion formed at an end portion on one side in a first direction of the semiconductor substrate over an entire length in a second direction intersecting the first direction, and a plurality of first collecting portions extending from the first base end portion toward the other side in the first direction. The main functional portion has the first electrode pattern stacked thereon. The first semiconductor layer also includes an isolation portion formed linearly at an end portion on the other side in the first direction of the semiconductor substrate over an entire length in the second direction. The first electrode pattern includes an isolation portion on which the first electrode pattern is not laminated. The second semiconductor layer includes a second base end portion adjacent to one side in the first direction of the isolation portion and extending in the second direction, and a plurality of second collecting portions extending from the second base end portion to the one side in the first direction.

In the solar cell, an average width of the isolation portion in the first direction may be smaller than an average width of the first collection portion in the second direction, and an average width of the first collection portion in the second direction may be smaller than an average width of the first base end portion in the first direction.

In the solar cell, an average width of the isolation portion in the first direction may be 2000 μm or less.

A solar cell manufacturing method according to an aspect of the present disclosure includes the steps of forming, on a back surface of a semiconductor wafer having a first conductivity type, a plurality of cell structures each having a first semiconductor layer having a conductivity type different from the semiconductor wafer, a second semiconductor layer having the same conductivity type as the semiconductor wafer, and a first electrode pattern laminated on the first semiconductor layer and a second electrode pattern laminated on the second semiconductor layer; and cutting the semiconductor wafer at a boundary of the cell structure. The plurality of cell structures are formed side by side in the first direction and oriented in the same direction. The first semiconductor layer includes a first base end portion formed at an end portion on one side in the first direction of the cell structure over an entire length in a second direction intersecting the first direction; a plurality of second collecting portions extending from the first base end portion toward the other side in the first direction; and a main functional portion on which the first electrode pattern is laminated; and a separation portion formed in a linear shape over an entire length in the second direction at an end portion on the other side in the first direction of the cell structure and on which the first electrode pattern is not laminated. In the step of forming the cell structure, the main functional portion and the isolation portion of the cell structure adjacent to one side in the first direction are continuously formed. In the step of cutting the semiconductor wafer, the main functional portion and the isolation portion of the cell structure adjacent to the one side in the first direction are separated from each other.

According to the present disclosure, it is possible to provide a solar cell capable of preventing short circuit at the time of shingling connection.

DETAILED DESCRIPTION

Figure 1:
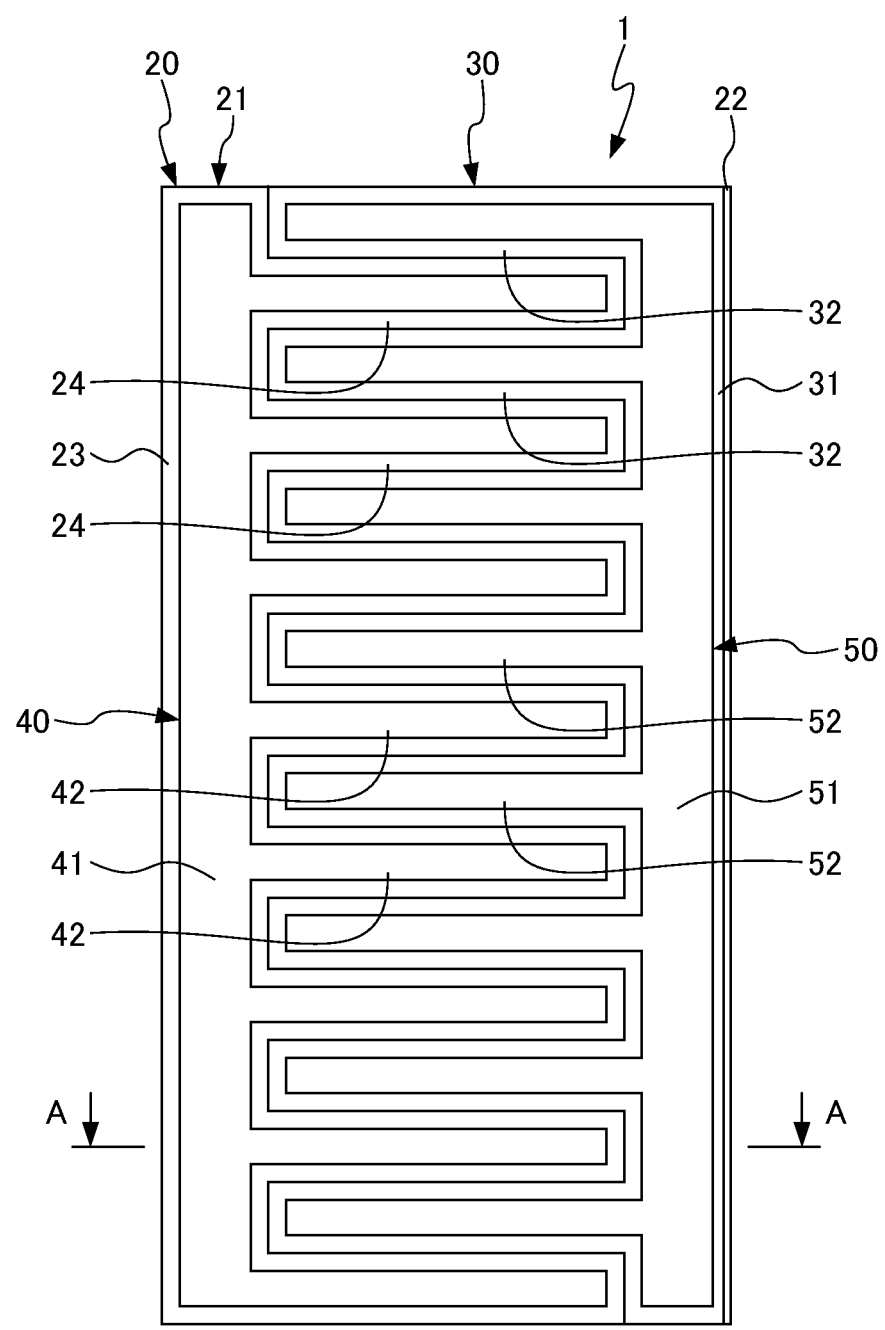
FIG. 1 is a rear view of a solar cell according to an embodiment of the present disclosure.

Hereinafter, embodiments of the present disclosure will be described with reference to the accompanying drawings. In the drawings, the same or corresponding portions are denoted by the same reference numerals. Further, for the sake of simplicity, illustration of members, reference numerals, and the like may be omitted, but in such a case, other drawings are referred to. In addition, the shapes and dimensions of various members in the drawings are adjusted so as to be easy to see for convenience.

<Solar Cell>

Figure 2:
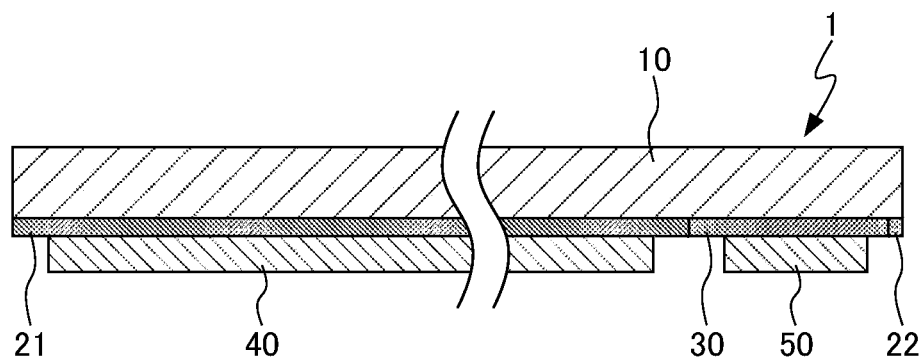
FIG. 2 is a cross-sectional view of the solar cell of FIG. 1 taken along line A-A.

FIG. 1 is a rear view showing a solar cell 1 according to an embodiment of the present disclosure. FIG. 2 is a cross-sectional view of the solar cell 1. The solar cell 1 includes a semiconductor substrate 10 having a first conductivity type; a first semiconductor layer 20 having a conductivity type different from that of the semiconductor substrate 10; a second semiconductor layer 30 having the same conductivity type as that of the semiconductor substrate 10; a first electrode pattern 40 laminated on the first semiconductor layer 20; and a second electrode pattern 50 laminated on the second semiconductor layer 30.

The semiconductor substrate 10 can be formed of a crystalline silicon material such as monocrystalline silicon or polycrystalline silicon. The semiconductor substrate 10 may be formed of another semiconductor material such as gallium arsenide (GaAs). The semiconductor substrate 10 is, for example, an n-type semiconductor substrate in which an n-type dopant is doped in a crystalline silicon material. Examples of the n-type dopant include phosphorus (P). The semiconductor substrate 10 functions as a photoelectric conversion substrate that absorbs incident light from the light receiving surface side to generate photocarriers (electrons and holes). Since crystalline silicon is used as the material of the semiconductor substrate 10, a relatively high output (a stable output regardless of illuminance) can be obtained even when the dark current is relatively small and the intensity of incident light is low.

The first semiconductor layer 20 and the second semiconductor layer 30 attract carriers having different polarity from each other from the inside of the semiconductor substrate 10, thereby collecting charges having different polarity. Specifically, when the semiconductor substrate 10 is of an n-type, the first semiconductor layer 20 is formed of a p-type semiconductor, and the second semiconductor layer 30 is formed of an n-type semiconductor. The first semiconductor layer 20 and the second semiconductor layer 30 can be formed of, for example, an amorphous silicon material containing a dopant imparting a desired conductivity type. Examples of the p-type dopant include boron (B), and examples of the n-type dopant include phosphorus (P).

The first semiconductor layer 20 and the second semiconductor layer 30 are formed in a substantially complementary shape on the rear surface of the semiconductor substrate 10. That is, substantially all regions of the back surface of the semiconductor substrate 10 are covered with either the first semiconductor layer 20 or the second semiconductor layer 30.

The first semiconductor layer 20 includes a main functional portion 21 on which the first electrode pattern 40 is laminated, and an isolation portion 22 isolated from the main functional portion 21 and not stacked with the first electrode pattern 40. The main functional portion 21 includes a first base end portion 23 formed at an end portion of the semiconductor substrate 10 on one side in the first direction over substantially the entire length in the second direction intersecting the first direction, and a plurality of first collecting portions 24 extending from the first base end portion 23 to the other side in the first direction. The isolation portion 22 is formed linearly over the entire length of the semiconductor substrate 10 in the second direction at the other end in the first direction.

The second semiconductor layer 30 has a second base end portion 31 adjacent to one side in the first direction of the isolation portion 22 and extending in the second direction, and a plurality of second collecting portions 32 extending from the second base end portion 31 to the one side in the first direction.

It is preferable that the first collector 24 and the second collector 32 are alternately formed with a relatively small constant width that allows the first electrode pattern 40 or the second electrode pattern 50, which will be described later, to be laminated, in order to reduce the carrier transfer distance in the semiconductor substrate 10 to improve the photoelectric conversion efficiency. The first base end portion 23 and the second base end portion 31 preferably have a width larger than that of the first collector portion 24 and the second collector portion 32 in order to reduce electric resistance because charges extracted by the first collector portion 24 and the second collector portion 32 flow into the first base end portion 23 and the second base end portion 31. Since the isolation portion 22 does not contribute to photoelectric conversion, the average width of the isolation portion 22 in the second direction is preferably a minimum width that can be continuously formed in the first direction. Therefore, the average width of the isolation portion 22 in the first direction is preferably smaller than the average width of the first collection portion 24 in the second direction, and the average width of the first collection portion 24 in the second direction is preferably smaller than the average width of the first base end portion 23 in the first direction. Specifically, the lower limit of the average width of the isolation portion in the first direction is preferably 100 μm, and more preferably 200 μm. On the other hand, the upper limit of the average width of the isolation portion in the first direction is preferably 2000 μm, and more preferably 1000 μm.

The first electrode pattern 40 and the second electrode pattern 50 are formed of a material having high conductivity such as metal. Further, the first electrode pattern 40 and the second electrode pattern 50 may be a laminate of a transparent electrode layer made of, for example, indium tin oxide (ITO), zinc oxide (ZnO), or the like laminated on the first semiconductor layer 20 and the second semiconductor layer 30, and a metal electrode layer mainly made of a metal.

The first electrode pattern 40 is provided to extract charges from the first semiconductor layer 20, and the second electrode pattern 50 is provided to extract charges from the second semiconductor layer 30. The first electrode pattern 40 and the second electrode pattern 50 are laminated so as to leave a margin at the outer edge portions of the first semiconductor layer 20 (the main functional portion 21) and the second semiconductor layer 30 in order to prevent a short circuit.

More specifically, the first electrode pattern 40 includes a first bus bar electrode 41 stacked on the first base end portion 23 and extending in the second direction, and a plurality of first finger electrodes 42 extending from the first bus bar electrode 41 toward the other side in the first direction and stacked on the respective first collecting portions 24. The second electrode pattern 50 includes a second bus bar electrode 51 stacked on the second base end portion 31 and extending in the second direction, and a plurality of second finger electrodes 52 extending from the second bus bar electrode 51 toward one side in the first direction and stacked on the respective second collecting portions 32.

As described above, in the solar cell 1, the first semiconductor layer 20 (the first base end portion 23 and the isolation portion 22) having a conductivity type different from that of the semiconductor substrate 10 exists over the entire length in the first direction at both ends in the first direction. Therefore, when a plurality of solar cells 1 are singularly connected in the first direction, even when the semiconductor substrate 10 comes into contact with the first semiconductor layer 20 of the adjacent solar cell 1, the semiconductor substrate 10 does not come into contact with the second semiconductor layer 30. Therefore, the solar cell 1 is not short-circuited during the shingling connection. In the figure, it is seen that the semiconductor substrate 10 of the solar cell 1 on the back side and the first semiconductor layer 20 and the second semiconductor layer 30 of the solar cell 1 on the front side do not contact each other due to the thicknesses of the first electrode pattern 40 and the second electrode pattern 50. However, since the actual thicknesses of the first electrode pattern 40 and the second electrode pattern 50 are small, the semiconductor substrate 10 of the solar cell 1 on the back side can be easily brought into contact with the isolation portion 22 by a slight inclination or deformation.

<Photovoltaic Cell Manufacturing Method>

Figure 3:
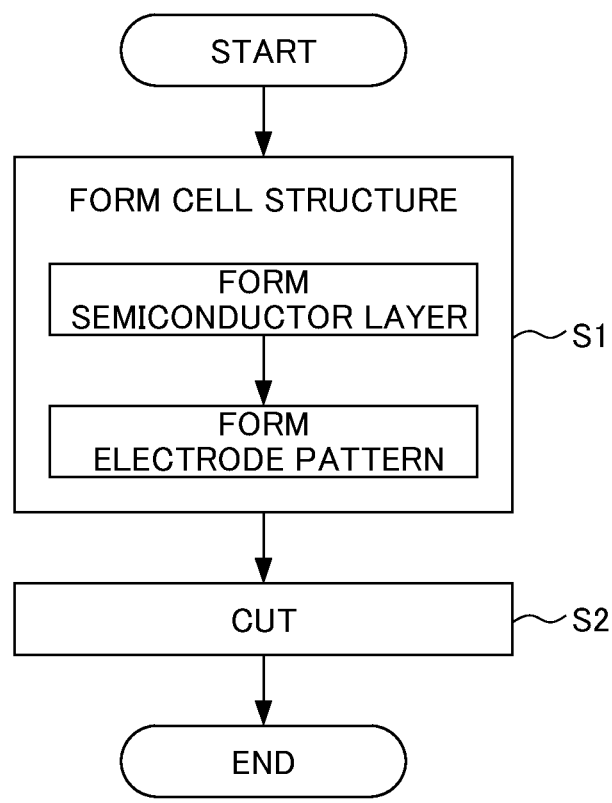
FIG. 3 is a flowchart showing a procedure of a method of manufacturing the solar cell of FIG. 1.

The solar cell 1 can be manufactured by a solar cell manufacturing method according to an embodiment of the present disclosure shown in FIG. 3.

The solar cell manufacturing method of the present embodiment includes a step of forming a plurality of cell structures C on the back surface of the semiconductor wafer W (step S1: cell structure forming step), and a step of cutting the semiconductor wafer W at the boundary of the cell structures C (step S2: cutting step). The semiconductor wafer W is a large plate-shaped semiconductor that can cut out a plurality of semiconductor substrates 10 by cutting. The cell structure C is a concept in which components other than the semiconductor substrate 10 of each solar cell, that is, the first semiconductor layer 20, the second semiconductor layer 30, the first electrode pattern 40, and the second electrode pattern 50 are combined.

Figure 4:
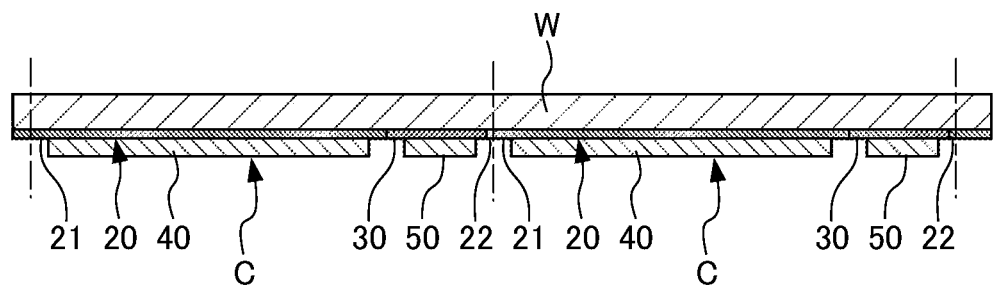
FIG. 4 is a cross-sectional view of the semiconductor wafer after the cell structure forming step of FIG. 3.

In the cell structure forming step of step S1, as shown in FIG. 4, a plurality of cell structures C are formed on the semiconductor wafer W, aligned in the first direction, and oriented in the same direction. FIG. 4 shows a cross section at the same position as FIG. 2, that is, a cross section taken along the line A-A of FIG. 1. As is apparent from the description of the solar cell 1, the first semiconductor layer 20 includes a first base end portion 23 formed at an end portion on one side in the first direction of each cell structure C over an entire length in the second direction intersecting the first direction; a plurality of first collecting portions 24 extending from the first base end portion 23 toward the other side in the first direction; a main functional portion 21 on which the first electrode patterns 40 are laminated; and a separation portion 22 formed linearly over an entire length in the second direction at an end portion on the other side in the first direction of each cell structure and on which the first electrode patterns 40 are not laminated.

In the cell structure forming step, the main functional portion 21 of the cell structure C on the other side in the first direction and the isolation portion 22 of the cell structure C adjacent to the other side in the first direction are continuously formed. That is, by forming the first semiconductor layer 20 so as to extend across the boundary (shown by the one-dot chain line) of the cell structure C, the main functional portion 21 of the cell structure C on the other side in the first direction and the isolation portion 22 of the cell structure C on the one side in the first direction are integrally formed. That is, in FIG. 4, the first semiconductor layer 20 of the right cell structure C extends slightly beyond the boundary of the cell structure C to the left cell structure C, and a portion beyond the boundary of the cell structure C constitutes the isolation portion 22 of the left cell structure C.

The first semiconductor layer 20 and the second semiconductor layer 30 can be formed by forming a resist pattern and selectively laminating a semiconductor material by a film forming technique such as CVD. The first electrode pattern 40 and the second electrode pattern 50 can be formed by, for example, etching of a metal layer formed by plating using a seed layer formed by sputtering or the like as an adherend, printing and firing of a conductive paste, or the like.

In the cutting step of step S2, by cutting the semiconductor wafer W along the boundary of the cell structure C, the main functional portion 21 of the cell structure C on the other side in the first direction and the isolation portion 22 of the cell structure C adjacent to the other side in the first direction are separated, and the solar cell 1 is cut out.

The semiconductor wafer W can be cut by forming a scribed groove by, for example, laser irradiation, milling, or the like, and cutting the semiconductor wafer W by bending the semiconductor wafer W.

<Solar Cell Modules>

Figure 5:
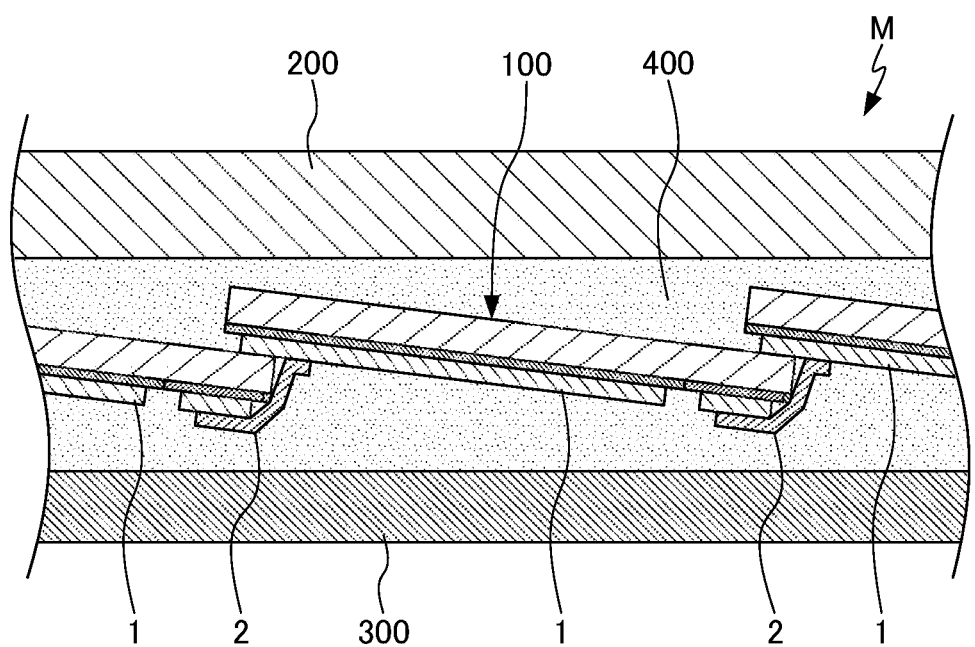
FIG. 5 is a cross-sectional view of a solar cell module having the solar cell of FIG. 1.

FIG. 5 is a cross-sectional view of a solar cell module M having a plurality of solar cells 1. The solar cell module M includes a plurality of solar cell strings 100 formed by connecting a plurality of solar cell cells 1 in a line, a plate-shaped surface protection material 200 covering the front side of the plurality of solar cell strings 100, a plate-shaped or sheet-shaped back surface protection material 300 covering the back side of the plurality of solar cell strings 100, and a sealing material 400 filled between the surface protection material 200 and the back surface protection material 300.

The solar cell string 100 includes a plurality of solar cells 1 arranged in a line in the first direction, and an interconnector 2 connecting adjacent solar cells. In the solar cell string 100, one end portion of the solar cell 1 in the first direction is arranged to overlap the back side of the other end portion of the adjacent solar cell 1 in the first direction. The interconnector 2 is formed of a conductor such as a metal foil or a metal net wire, and connects the first bus bar electrode 41 of the solar cell 1 stacked on the front side and the second bus bar electrode 51 of the solar cell 1 stacked on the back side.

In the solar cell string, as shown in the figure, the interconnector 2 can abut on the isolation portion 22 of the first semiconductor layer 20, but since the isolation portion 22 is isolated from the main functional portion 21 that contributes to photoelectric conversion, there is no disadvantage even when the interconnector 2 comes into contact with the main functional portion 21.

The surface protection material 200 protects the solar cell string 100 by covering the surface of the solar cell string 100 with the sealing material 400 interposed therebetween. The surface protection material 200 is preferably formed of a transparent and scratch-resistant material such as glass, polycarbonate, or acrylic resin, and is excellent in weatherability. Specifically, examples of the material of the surface protection material 200 include a transparent resin such as an acrylic resin or a polycarbonate resin, and glass. Further, the surface of the surface protection material 200 may be processed into an uneven shape or may be covered with an antireflection coating layer in order to suppress reflection of light. The surface protection material 200 may have a light shielding region in the outer peripheral portion.

The surface protection material 200 preferably has a sufficient thickness to provide a strength capable of maintaining the shape of the solar cell module M. The solar cell module M having a desired shape can be obtained by using the surface protection material 200 formed in advance into a desired shape.

The solar cell string 100 may be formed to have a length substantially equal to the length in the first direction of the light-transmitting region inside the light-shielding region of the surface protective material 200. Thus, the effective area of the solar cell string 100 received by the solar cell string 100 is increased, and the photoelectric conversion efficiency can be prevented from being lowered due to the fact that light does not enter a part of the solar cell 1 at the end portion of the solar cell string 100. The plurality of solar cell strings 100 may be connected to each other by a wiring material (not shown).

The back surface protection material 300 is a layer for protecting the back surface side of the solar cell string 100. The material of the back surface protective material 300 is not particularly limited, but is preferably a material that prevents water or the like from entering (a material having high water barrier properties). Specifically, the back surface protective material 300 can be formed of, for example, a resin such as glass, polyethylene terephthalate (PET), acrylic resin, polyethylene (PE), olefinic resin, fluororesin, or silicone-containing resin. The back surface protection material 300 may be a laminate of a resin layer and a metal layer such as aluminum foil. In addition, it is preferable that the color (light reflection characteristic) when viewed from the front surface side of the back surface protection material 300 is similar to the color of the front surface side of the solar cell 1 in order to improve the aesthetics of the solar cell module M by making the gaps between the solar cell strings 100 less conspicuous.

The sealing material 400 seals the solar cell string 100 in the space between the front surface protective material 200 and the rear surface protective material 300, and suppresses deterioration of the solar cell string 100 due to moisture or the like. The sealing material 400 is formed of a material having transparency and adhesiveness to the surface protective material 200 and the solar cell string 100. The material forming the sealing material 400 preferably has thermoplastic properties so that the gap between the surface protection material 200 and the solar cell string 100 can be sealed by hot pressing. Specifically, as a material forming the sealing material 400, for example, a resin composition mainly containing ethylene/vinyl acetate copolymer (EVA), ethylene/α-olefin copolymer, ethylene/vinyl acetate/triallyl isocyanurate (EVAT), polyvinyl butyrate (PVB), acrylic resin, urethane resin, silicone resin, or the like can be used.

Although the embodiments of the present disclosure have been described above, the present disclosure is not limited to the embodiments described above, and various changes and modifications are possible. The solar cell according to the present disclosure may include components other than those described in the above embodiment. By way of example, a solar cell according to the present disclosure may have an intrinsic semiconductor layer separating a first semiconductor layer and a second semiconductor layer. The planar shape of the main functional portion of the first semiconductor layer, the planar shape of the second semiconductor layer, and the planar shape of the first electrode pattern and the second electrode pattern can be appropriately changed.

What is claimed is:

1. A solar cell comprising:
   a semiconductor substrate having a first conductivity type;
   a first semiconductor layer on a rear surface of the semiconductor substrate and having a conductivity type different from that of the semiconductor substrate;
   a second semiconductor layer on the rear surface of the semiconductor substrate and having a same conductivity type as that of the semiconductor substrate;
   a first electrode pattern stacked on the first semiconductor layer;

a second electrode pattern stacked on the second semiconductor layer, wherein the first semiconductor layer has a main functional portion which has a first base end portion at a first end portion on a first side in a first direction of the semiconductor substrate over an entire length of the semiconductor substrate in a second direction intersecting the first direction, and a plurality of first collecting portions extending from the first base end portion toward a second side in the first direction; and on which the first electrode pattern is stacked; and an isolation portion which is configured linearly at a second end portion on the second side of the semiconductor substrate over an entire length in the second direction; and on which the first electrode pattern is not stacked, wherein the second semiconductor layer has a second base end portion adjacent to of the isolation portion and extending in the second direction, and a plurality of second collecting portions extending from the second base end portion to the first side in the first direction, and wherein the first semiconductor layer is physically disconnected from the isolation portion and is separated from the isolation portion by the second semiconductor layer.

2. The solar cell according to claim 1, wherein;

an average width of the isolation portion in the first direction is smaller than an average width of the plurality of first collecting portions in the second direction, and the average width of the plurality of first collecting portions in the second direction is smaller than an average width of the first base end portion in the first direction.

3. The solar cell according to claim 1, wherein an average width of the isolation portion in the first direction is 2000 μm or less.

4. The solar cell according to claim 2, wherein an average width of the isolation portion in the first direction is 2000 μm or less.

5. A solar cell manufacturing method comprising:

forming a plurality of cell structures on a semiconductor wafer, each having a first semiconductor layer having a first conductivity type different from the semiconductor wafer, a second semiconductor layer having a same conductivity type as the semiconductor wafer, and a first electrode pattern stacked on the first semiconductor layer and a second electrode pattern stacked on the second semiconductor layer on a rear surface of the semiconductor wafer having the first conductivity type;

cutting the semiconductor wafer at a boundary between adjacent cell structures; wherein the plurality of cell structures are arranged in a first direction, each having a same orientation;

each first semiconductor layer comprises:

a main functional portion which has a first base end portion formed at a first end portion on a first side of a cell structure in a first direction of the semiconductor wafer over an entire length of the cell structure in a second direction intersecting the first direction and a plurality of first collecting portions extending from the first base end portion toward a second side of the cell structure in the first direction; and on which the first electrode pattern is stacked;

an isolation portion which is formed linearly at a second end portion on the other second side over an entire length of the cell structure in the second direction; and on which the first electrode pattern is not stacked, wherein:

the main functional portion of a first cell structure and the isolation portion of a second cell structure adjacent to the first cell structure are continuously formed, in forming of the first cell structure and the second cell structure; and the main functional portion of the first cell structure and the isolation portion of the second cell structure are separated from each other, by cutting the semiconductor wafer, wherein, within each cell structure, the isolation portion is separated from the first semiconductor layer by the second semiconductor layer.

* * * * *